United States Patent [19]

Kleinknecht et al.

[11] 4,408,884

[45] Oct. 11, 1983

[54] OPTICAL MEASUREMENTS OF FINE LINE PARAMETERS IN INTEGRATED CIRCUIT PROCESSES

[75] Inventors: Hans P. Kleinknecht, Bergdietikon, Switzerland; William E. Ham, Mercerville, N.J.; Heinrich Meier, Urdorf, Switzerland

[73] Assignee: RCA Corporation, New York, N.Y.

[21] Appl. No.: 278,448

[22] Filed: Jun. 29, 1981

[51] Int. Cl.$^3$ ............................................ G01B 11/02
[52] U.S. Cl. ..................................... 356/355; 29/574; 356/237
[58] Field of Search ............... 356/354, 355, 356, 237; 29/524

[56] References Cited

U.S. PATENT DOCUMENTS

| | | | |
|---|---|---|---|
| 4,180,830 | 12/1979 | Roach | 358/128 |
| 4,200,396 | 4/1980 | Kleinknecht et al. | 356/384 |
| 4,236,823 | 12/1980 | Roach et al. | 356/351 |

OTHER PUBLICATIONS

H. P. Kleinknecht and H. Meier, "Linewidth Measurement on IC Masks and Wafers by Grating Test Patterns," *Applied Optics*, vol. 19, pp. 525–533, (1980).
W. R. Roach, et al., "Diffraction Spectometry for VideoDisc Quality Control," *RCA Review*, vol. 39, Sep. 1978, pp. 472–511.
Technical Note 1143, mailed Mar. 16, 1976, entitled "Method For Measuring The Average Aperture Size of a Plurality of Apertures in a Kinescope Shadow Mask," by A. H. Firester.
H. P. Kleinknecht, et al., "Use of Large Area Grating Patterns for Scanning of Linewidth Across IC Masks and Wafers," Abst. S35, p. 203, Europhys. Conf. ESSDERC, Sep. 15–18, 1980, York, England.
W. E. Ham et al., "A Method for Determining the Sources of LSI Linewidth Errors in IC Processes," Abst. S36, p. 205, Europhys. Conf. ESSDERC, Sep. 15–18, 1980, York, England.

*Primary Examiner*—Vincent P. McGraw
*Assistant Examiner*—Matthew W. Koren
*Attorney, Agent, or Firm*—Birgit E. Morris; Donald S. Cohen; Joseph D. Lazar

[57] ABSTRACT

The image transfer process in integrated circuit (IC) processes such as large scale integrated (LSI) device processes manufacturing is monitored by optical measurements on a stage-by-stage basis by measuring a monitor specimen or test sample formed with a diffraction grating of a predetermined pattern having a strip width corresponding to the desired line widths of the wafers or masks being monitored. A beam of monochromatic light is scanned over the test sample to generate diffracted beams of various orders. Line width, line depth, line edge profile process errors can be determined by various combinations of the diffracted beams of the zero, first, second, etc., orders. The test sample is scanned to generate a display for data representing the diffracted beams. The parameter data can be stored for later use for quality control, process monitoring, circuit design parameters, and the like. Moreover, gross process errors are visually discernible on the monitor specimen.

21 Claims, 11 Drawing Figures

GRATING TEST PATTERN

OPTICAL MEASUREMENTS OF FINE LINE PARAMETERS IN INTEGRATED CIRCUIT PROCESSES

BACKGROUND OF THE INVENTION

This invention relates to optical measurements of fine dimensional parameters in integrated circuit (IC) processes and more particularly the measurement of the line width dimensions of a diffraction grating pattern including the thickness of the lines as well as the line edge profile.

In manufacturing integrated circuit (IC) devices and masks many steps are performed in which a pattern of material is disposed on a substrate. The more recent integrated circuits, particularly in the large scale integrated circuit (LSI) art, have tighter lateral dimensional tolerances which require checking at various stages of processing the masks and the substrates.

Many methods are known in the art for measuring the line width of the lines patterned for the IC circuits in various stages of the image transfer process. Line widths can be measured using diffraction gratings and a monochromatic light source such as a laser as described in U.S. Pat. No. 4,200,396, issued on Apr. 29, 1980 to Kleinknecht and Bosenberg and U.S. patent application Ser. No. 101,166, filed Dec. 7, 1979 by Kleinknecht and Bosenberg. According to the procedure described in this patent and application, a diffraction pattern is exposed to a laser beam which generates a plurality of diffracted optical beams. Signals are detected from the beams to generate a signal which is processed to provide information of the line width of the diffraction pattern. This technique is embodied in apparatus disclosed in "Linewidth Measurement on IC Masks and Wafers by Grating Test Patterns" by H. P. Kleinknecht and H. Meier, *Applied Optics*, 19, 525 (1980), and also described in U.S. patent application Ser. No. 121,529, filed Feb. 14, 1980 by H. P. Kleinknecht and H. Meier, now U.S. Pat. No. 4,330,213, issued May 18, 1982.

In the so-called video disc art, the diffraction-like grooves and the information-generated diffraction-like undulations in the base surface of the grooves are both optically monitored for diffraction signals generated in response to a laser light beamed on the disc. A display is made of the diffraction signals which provides a means to identify defects in the video disc structure. See, by way of example, the following U.S. patents, U.S. Pat. No. 4,180,830, issued Dec. 25, 1979 to W. R. Roach, and U.S. Pat. No. 4,236,823, issued Dec. 2, 1980 to W. R. Roach and P. Sheng. See also an article by W. R. Roach, et al., entitled "Diffraction Spectrometry for VideoDisc Quality Control," *R.C.A. Review*, Vol. 39, September 1978, p. 472–511.

In the art of making kinescope shadow masks, the aperture size can be measured by exposing the mask to laser light to develop light-diffraction patterns having at least two different interference fringes. Signals representative of the fringes are used to determine the size and shape of apertures in the mask. See Technical Note 1143, published by RCA, and mailed Mar. 16, 1976, entitled "METHOD FOR MEASURING THE AVERAGE APERTURE SIZE OF A PLURALITY OF APERTURES IN A KINESCOPE SHADOW MASK" by A. H. Firester for a description of the method.

In the art of LSI device fabrication there is a need to control the line width, depth and profile of the lines on the IC as it evolves from the original design, through to the final state in which the circuit device is ready for use. This evolutionary manufacturing process is essentially an image transfer process usually implemented by a computerized program to fabricate the basic mask. This process in step-by-step stages causes the desired lines to degrade by varying undesirably in size and uniformity as they are generated in typically silicon and oxide form.

SUMMARY OF THE INVENTION

According to the method and apparatus of the present invention, a diffraction grating pattern on a large area substrate such as a wafer (serving as a test sample) is monitored by scanning a light beam over the grating pattern to generate optical reflections of several diffraction orders. The beam size of the scanning light beam is substantially greater than the grating period (d) but substantially smaller than the size of the grating pattern. The optical reflections are detected to determine the relative intensities of each of two or more diffraction signals of the reflections. Electrical signals representing the diffraction signals are processed and applied to an image processor providing stored or real time information on a chart recorder, CRT or print out representing deviations of the grating pattern from a reference. The diffraction signals can be used to measure or indicate change in lateral dimensions, layer thickness or edge profile of the line elements of the diffraction pattern as desired. Moreover, the diffraction pattern on a wafer may be used as a test sample to monitor any selected one or more process steps in the fabrication of a wafer to a useful circuit device. The test sample wafer can be used as a control to evaluate each step in a semiconductor manufacturing process without the risk of processing the desired wafer product.

DETAILED DESCRIPTION OF A PREFERRED EMBODIMENT

There are many stages in the conventional image formation process wherein the LSI parameter monitoring measurements made according to the present invention on a test sample wafer can be utilized. For illustrative purposes five of such stages are useful in explaining the monitoring principle of this invention. The many other stages of the typical image formation process during which the invention can be used will be readily apparent to those skilled in this art as will become evident from the embodiments described herein.

Figure 1:
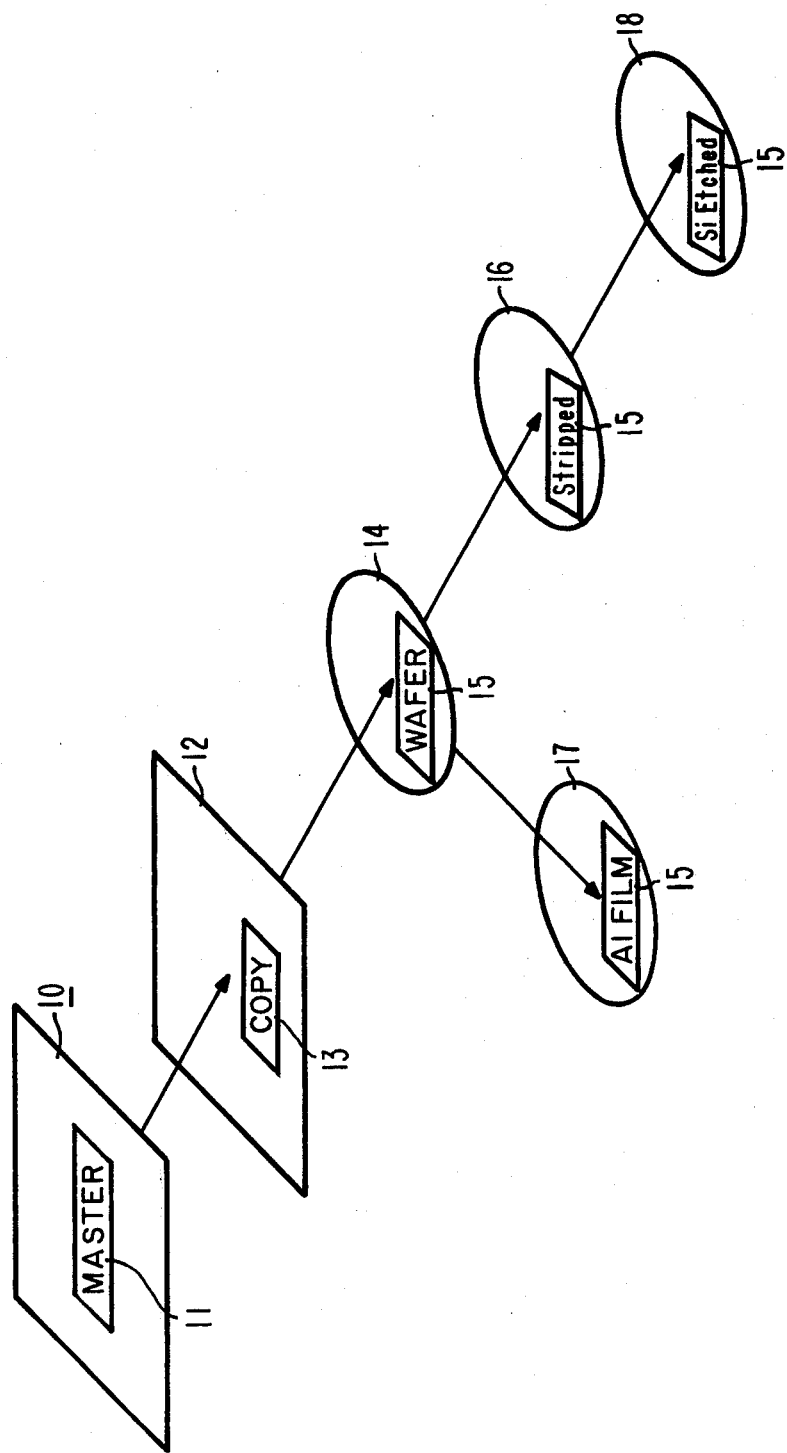
FIG. 1 is a flow chart of several stages in a typical device formation process during which LSI line parameter measurements and monitoring are performed in the practice of the present invention.

The flow chart of FIG. 1 shows five typical stages of the image transfer process for making an LSI device from the software state to a more advanced if not final state. At stage 10 the master mask 11 is developed typically by a manufacturing electron beam exposure system (MEBES) of any suitable form known in the art. The MEBES system is essentially a computer controlled system which responds to input data of desired line width spacing and the like to generate a master mask. Other systems for making master masks may be used as desired. The master mask 11 is then used to generate at station 12 a mask copy 13 formed preferably of chromium. The mask copy 13 made at stage 12 is used to generate lines and art work on a wafer 15 at stage 14. Typically, prior to that step the wafer 15 is provided with a baked photoresist. Then at stage 14 wafer 15 is exposed through the mask copy 13 and developed. Thereafter, at stage 16 the wafer 15 is etched, for example of its SiO2, using the photoresist as an etch mask and the photoresist is then stripped from the wafer. Subsequently, at stage 18 the silicon film is etched from the wafer 15 using the SiO2 pattern as an etch mask. At the end of any of stages 10, 12, 14, 16, or 18 the parameters of the desired lines are monitored by measuring a monitor wafer or mask according to the invention as will be described. In an alternative, process, at stage 14 the wafer 15 may be merely provided with an etched aluminum film 17.

The principle of diffraction grating line width measurements using a fixed beam is well known as described, for example, in the aforementioned U.S. Pat. No. 4,200,396 and U.S. patent application Ser. No. 101,166 as well as the above-identified article in Applied Optics by Kleinknecht, et al.

Figure 2:
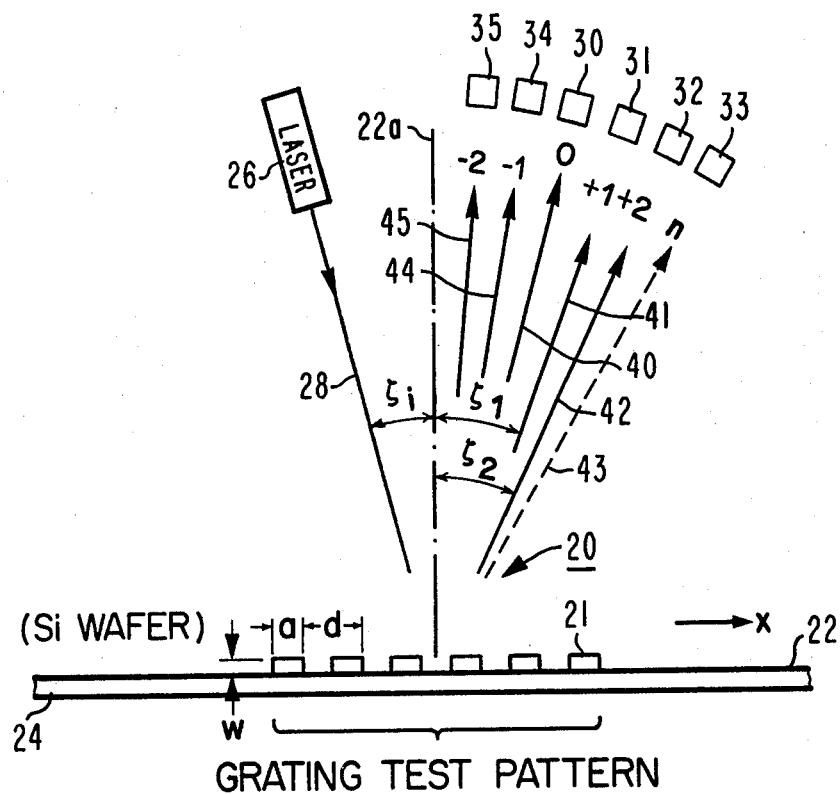
FIG. 2 is a schematic of a diffraction grating pattern useful in understanding the present invention showing the generation of the diffraction order signals in response to an incident light beam.

FIG. 2 similar to FIG. 1(b) of the Applied Optics Article, illustrates a grating test pattern 20 formed, for example, by etching a surface 22 of a substrate 24 of silicon. The pattern 20 is formed of a series of parallel lines or strips 21 seen in edge view in FIG. 2 having a width a, a thickness w, and a periodicity of d. Monochromatic light illuminates the grating from a laser 26 providing a beam 28 which strikes the grating 20, causing a reflection of signals of various diffraction orders identified as zero order [I(0)] beam 40, positive first order [I(1)] beam 41, positive second order [I(2)] beam 42, positive n order [I(n)] beam, negative first order [I(1)] beam 43 and negative second order [I(2)] beam 44 where n is an integer. The positive and negative order beams are so designated merely to relate in space to the zero order beam 40 as the reference location. Other diffractions may exist and may be utilized, but are not shown.

The intensity of the several diffracted beams are detected by associated silicon detectors 30-35 suitably positioned in the reflected beam pattern of diffracted beams to receive optical signals corresponding to the desired order to be detected. The laser beam at incident angle $\xi_i$ relative to the nornal 22a causes diffraction signals along angle $\xi_1$, $\xi_2$, etc. The reliability of the laser for use with the diffraction grating is improved by avoiding internal reflections. Accordingly, as known in the art, the angle of incidence for minimum disturbing reflections is the Brewster angle such that:

$$\tan \xi = n_s \qquad (1)$$

where $\xi$ is the incidence angle, $n_s$ is the refractive index of the material of the grating strips 21 and wherein the polarization of the beam 28 is in the plane of the incidence. The laser beam, when disposed as shown in FIG. 2, provides diffraction patterns that are in the reflective mode. A wafer is formed entirely of such a diffraction pattern to serve as the test sample according to the invention, indicated as test sample 200 shown in FIG. 4.

It is well known that if the wafer and grating were transparent that the laser caould be transposed in the position below the wafer 24 to provide a transmissive diffraction pattern. The use of a transmissive or reflective diffraction pattern is a matter of choice for masks. A transmissive pattern would not be useful for wafers which are typically not transparent. The intensity of the various diffracted beams are utilized in the apparatus illustrated in FIG. 4 and FIG. 11 to be described.

Figure 3:
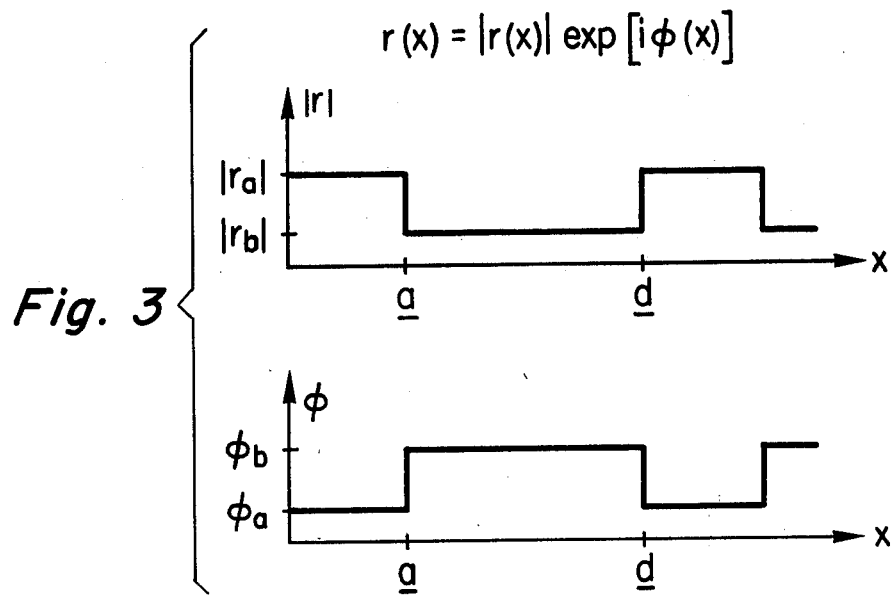
FIG. 3 is a plot of rectangular reflectivity functions used in determining the departure from the ideal profile of a rectangular line.
Figure 4:
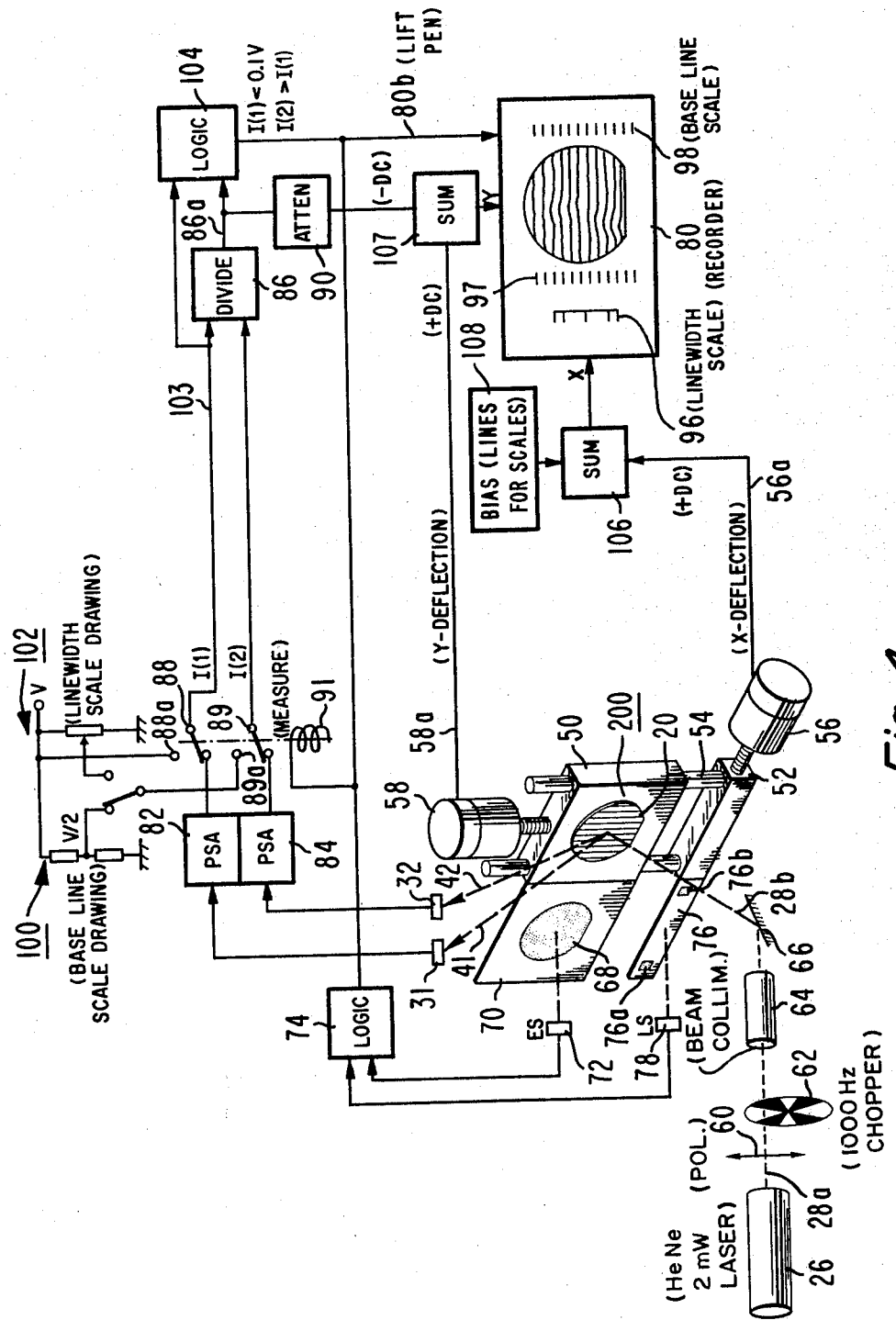
FIG. 4 is a block schematic illustrating one form of the measuring apparatus useful in practicing the invention.

Before proceeding to a description of the apparatus of FIG. 4, reference is made to FIG. 3 which is a plot of a rectangular grating profile useful in understanding the principles of the invention. The reflection of the laser beam 28 from the grating 20 results in the diffraction orders illustrated in FIG. 2. The intensity of the diffraction orders are determined by the detailed shape of the grating profile 20. If the grating period d is large compared to the wavelength of the laser beam 28, and if the grating profile is not too deep (dimension w), the scalar diffraction theory of Kirchoff and Fraunhofer can be used. This scalar theory is well known. Reference is made to any standard text on the subject, for example, Principles of Optics, by M. Born and E. Wolf, (Pergamon, London, 1965), for a detailed description of it. Accordingly, the amplitudes of diffraction orders are proportional to the Fourier amplitudes of the reflectivity profile of the grating (20). The theory becomes particularly simple if the grating profile is a rectangular wave, that is, if the absolute magnitude and phase of the reflectivity r(x) are rectangular functions of x. In general, x is the coordinate in the plane of the grating running perpendicular to the grating line. As shown in FIG. 2, x is the direction of the movement of the grating 20 under the line beam 28 for this embodiment. The rectangular functions of x are described from the following equation:

$$r(x) = r(x) \exp [i\phi(x)] \qquad (2)$$

wherein r is the reflectivity and $\phi$ is the phase angle. As shown in FIG. 3, the absolute value of the reflectivity r is plotted showing the width a and the periodicity d as well as the phase $\phi$ in the lower plot of FIG. 3. For this illustration the ratio of the second to the first order intensity signals as detected by detectors 32 and 31, respectively, as shown in FIG. 2, can be represented as follows:

$$I(2)/I(1) = \cos^2(\pi a/d) \qquad (3)$$

wherein d is the grating (period) periodicity. In the practice of the invention a is, in fact, the average width of all of the grating lines of that part of the grating 20 which is exposed to the laser beam 28.

According to the present invention, the diffraction grating 20 is made to comprise the whole area of a mask or wafer that is to be used for monitoring the image transfer process described hereinabove (FIG. 1). The diameter of the laser beam 28 is made small enough to resolve local line width variations but still large enough to comprise many grating lines 21, e.g., 100 lines 21. It has been discovered that this will provide well-defined diffraction orders and a good average with respect to the line width a. According to the present embodiment, the grating dimensions have a nominal line width of a=2 micrometers and a grating period d of 8 micrometers. It will be noticed that these line widths are quite small and approach the current optical lithography limits. Moreover, the ratio of a/d is, for this embodiment, ¼ which provides the best sensitivity as indicated by equation (3) described hereinabove. Accordingly, with a laser beam 28 of 1 millimeter in diameter, the apparatus provides a means to measure the average of over 100 grating lines 21 with good resolution. The time required for taking a typical scan plot such a shown in FIG. 5, to be described, is 40 minutes for laboratory type equipment. This scanning time can be reduced particularly if fewer lines of scan are required or by using more rapidly responding detectors and data processing as will be illustrated in FIG. 11.

Figure 5:
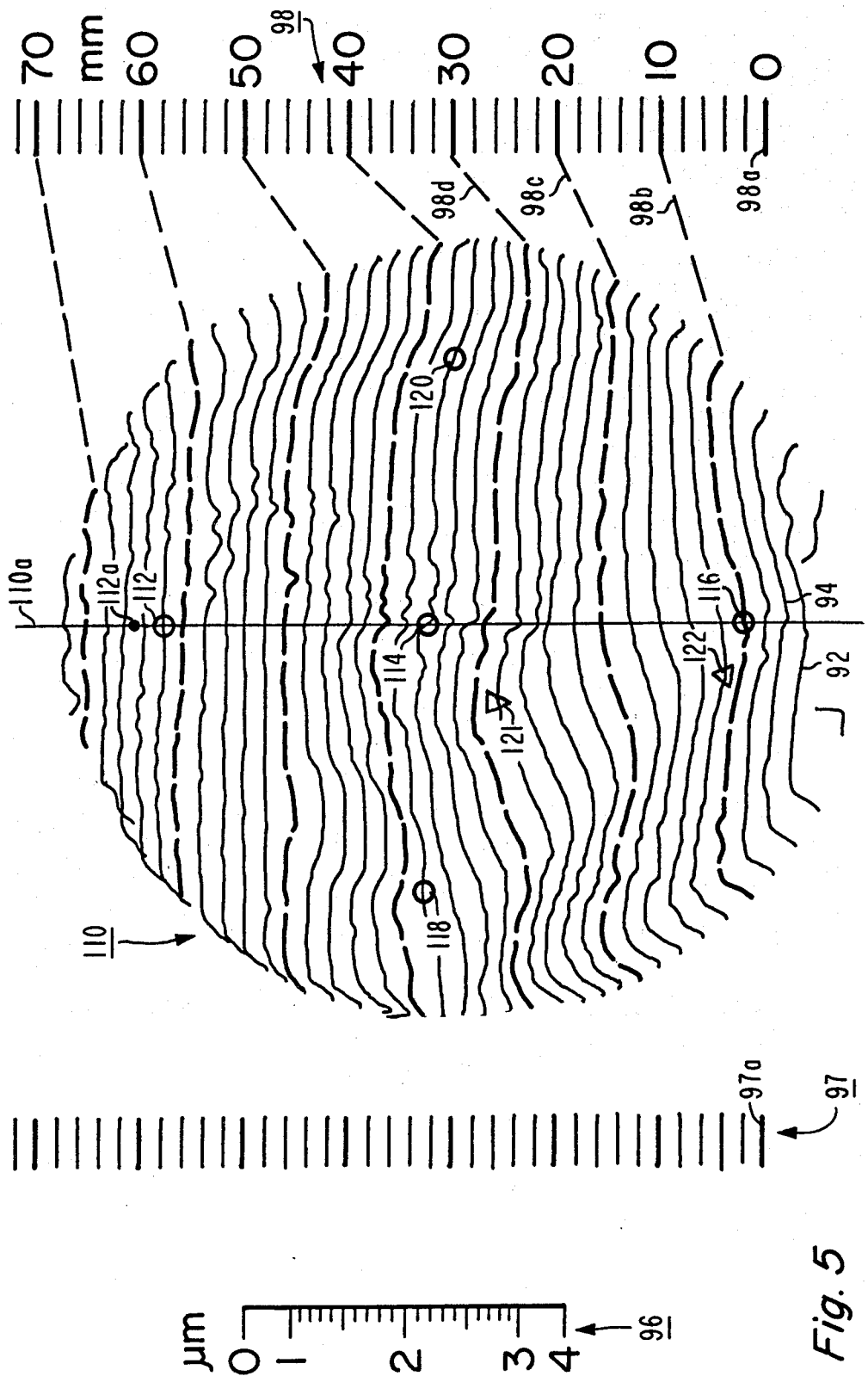
FIG. 5 illustrates a typical line scan plot generated by the apparatus illustrated in FIG. 4.

Reference is now made to FIG. 4, which illustrates in schematic form the apparatus used to provide the scan plot such as illustrated in FIG. 5 for determining line width, line thickness and line edge profile.

Figure 11:
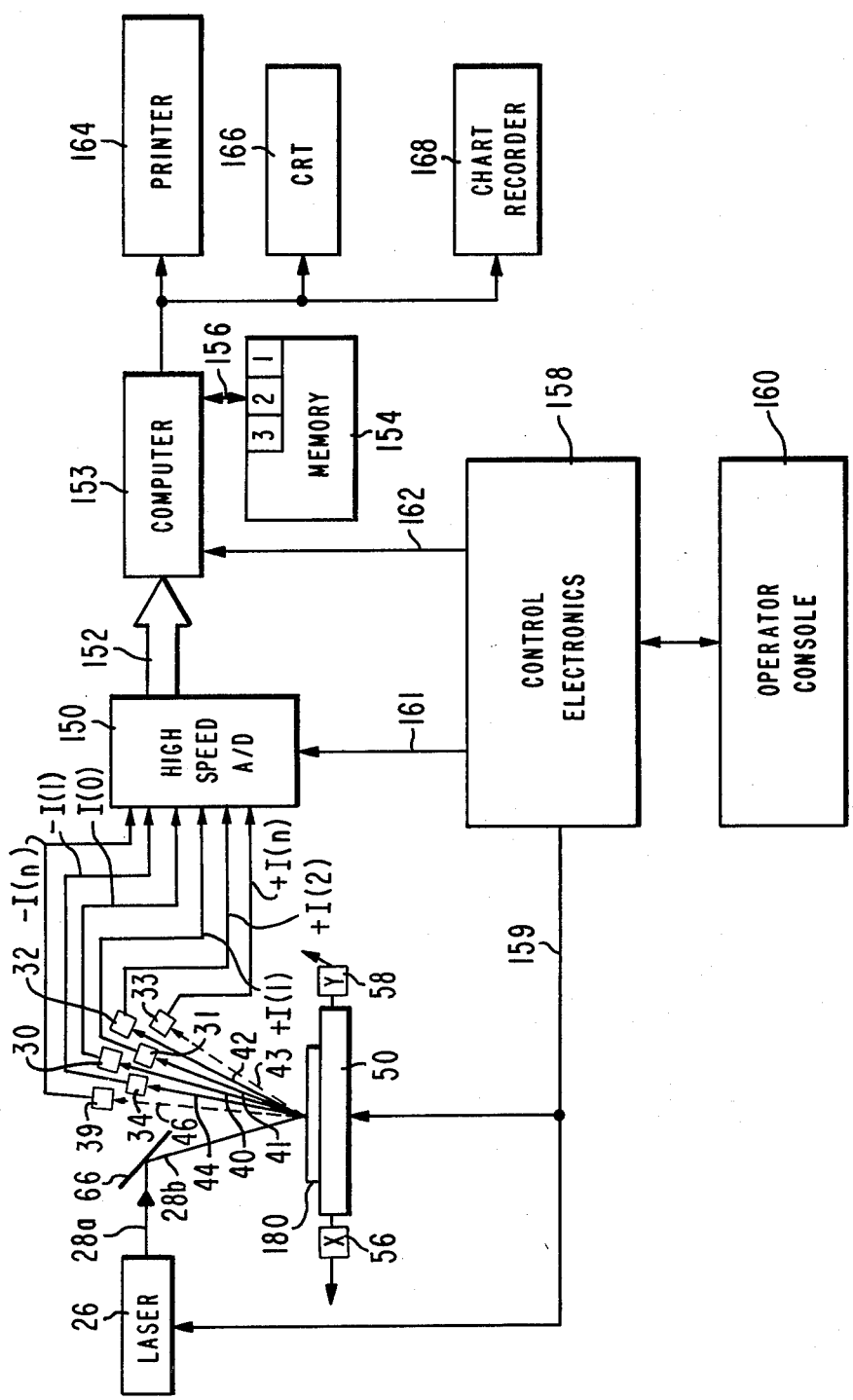
FIG. 11 is a block schematic of an image processing system according to another embodiment of the invention.

The apparatus of FIG. 4 is simplified to provide only the first [I(1)] and second [I(2)] order diffraction signals to determine line width. Higher order positive or negative signals [I(n)] as well as the zero order signal [I(0)] will be provided in such apparatus to determine line depth and profile as will be further described. FIG. 11 illustrates a system using n diffraction orders processed with digital signals.

The mask or wafer 200 is formed with a grating pattern 20 (FIG. 2) extending over the entire surface thereof and is supported on a stage 50 oriented in a vertical position in the y direction of line 21. The stage 50 is supported on a carriage 52 by guide rod support members 54. The stage 50 is moved in a horizontal x direction by a motor 56 and in a y direction by a motor 58. Motors 56 and 58 can be stepping motors by which the respective x and y positions of the wafer 200 can be determined by the number of steps each motor is moved. In the alternative, the motors can be d.c. motors provided with potentiometers or encoders to provide x and y positional information signals.

Laser 26, preferably a red He-Ne laser having a wavelength λ, equal to 0.6328 micrometers, provides a beam 28a, which is polarized in the direction indicated by arrow 60, chopped to 1,000 Hz by a chopper 62, collimated by a beam collimator 64 and thence reflected by a mirror 66 as beam 28b to the mask or wafer 200.

Stage 50 is also provided with a template or reference pattern 68 carried by extended support 70 attached to stage 50. Attached to the stage 50 are several other templates to control the pen of the recorder 80. Template 68 follows the x and y-motions of the carriage 50 and is shaped to correspond to that of the wafer or mask 200. An optical edge sensor 72 generates a signal when the laser beam 28b reaches the edge of the wafer 200 by sensing the corresponding edge of template 68. The sensor 72 is suitably displaced in a fixed position from the position of the beam to accurately correspond to the movement of the wafer 200. Signals from the sensor 72 are applied to a circuit of logic 74 for controlling solenoid 91 for switches 89 and 88 and the lift pen via bus 80b. Thus, as long as the detector 72 senses the presence of template 68 of the reference pattern, the solenoid 91 will maintain the switches 88 and 89 as shown and the pen will be in position for writing.

The template 76 follows only the x-motion of the stage 50. The reference marks 76a and 76b on template 76 are used to draw the base line scales 97 and 98 by recorder 80 as shown in FIG. 5 also. The sensor 78 senses the template portions 76a and 76b to provide signals to logic 74 to control solenoid 91 and thus switches 88 and 89. Moreover, logic 74 provides a control signal in response to the detector 78 to the lift pen operation of the recorder 80 via bus 80b.

Thus, the edge sensor 72 is used to lift the recorder pen when the laser beam is not on the wafer 200. This lift signal is overwritten by the base line scale sensor 78 to drop the pen for automatically drawing the base line scales 97 and 98 before and after each scan. The same logic 74 also controls the switches 88 and 89 to provide a reference y-control signal having a value V/2, corresponding to $I(2)/I(1)=0.5$ or a=2 micrometers (for this embodiment) whenever the laser beam 28b is not on the wafer area 200, where V is the amplitude of voltage V. In this way the base lines of the scales 97 and 98 are automatically drawn at y-positions corresponding to a=2 micrometers.

Figure 6:
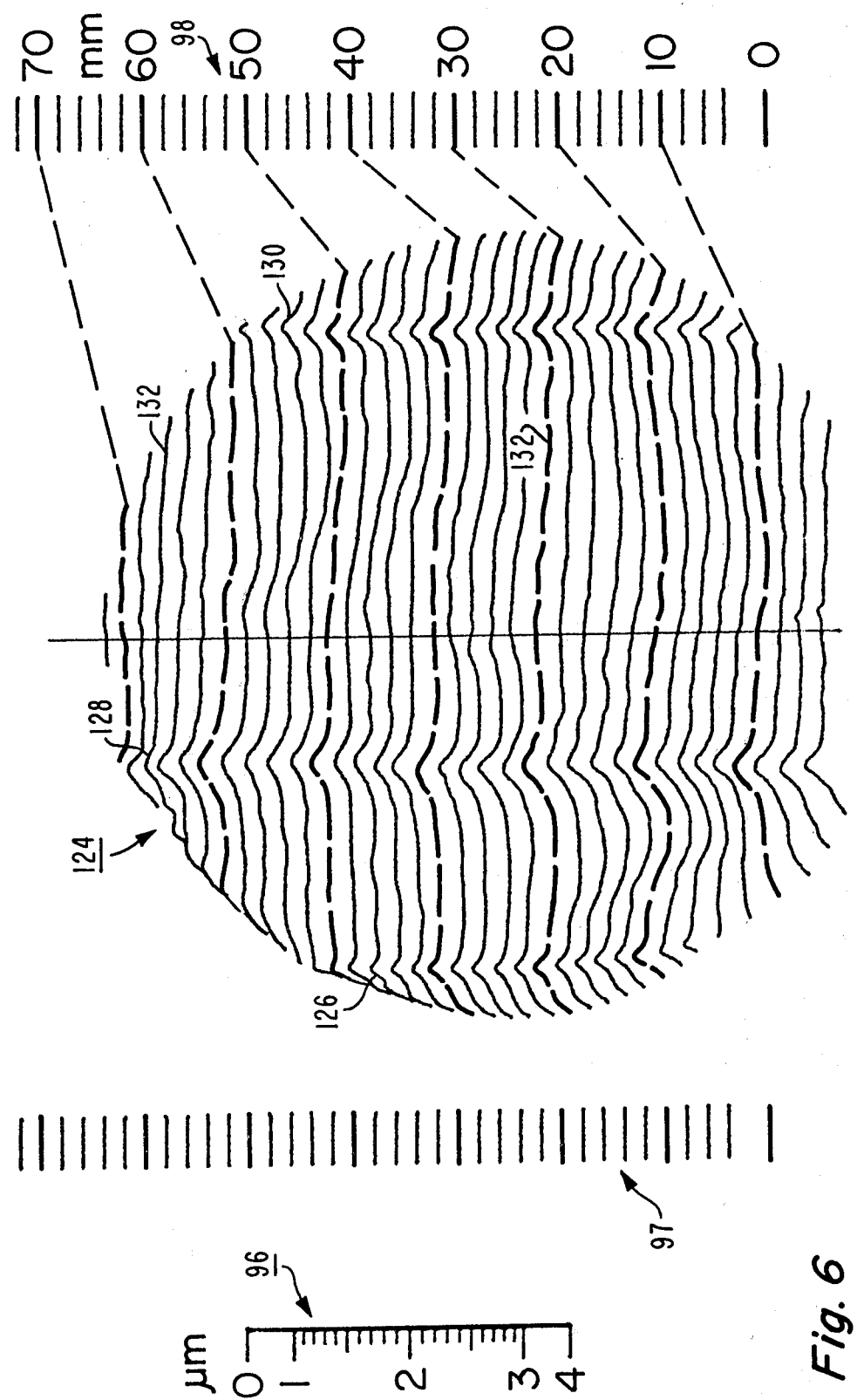
FIG. 6 is another scan plot illustrating excursions in the line scans useful in understanding one or more of the parameters of the diffraction grating being scanned.
Figure 7:
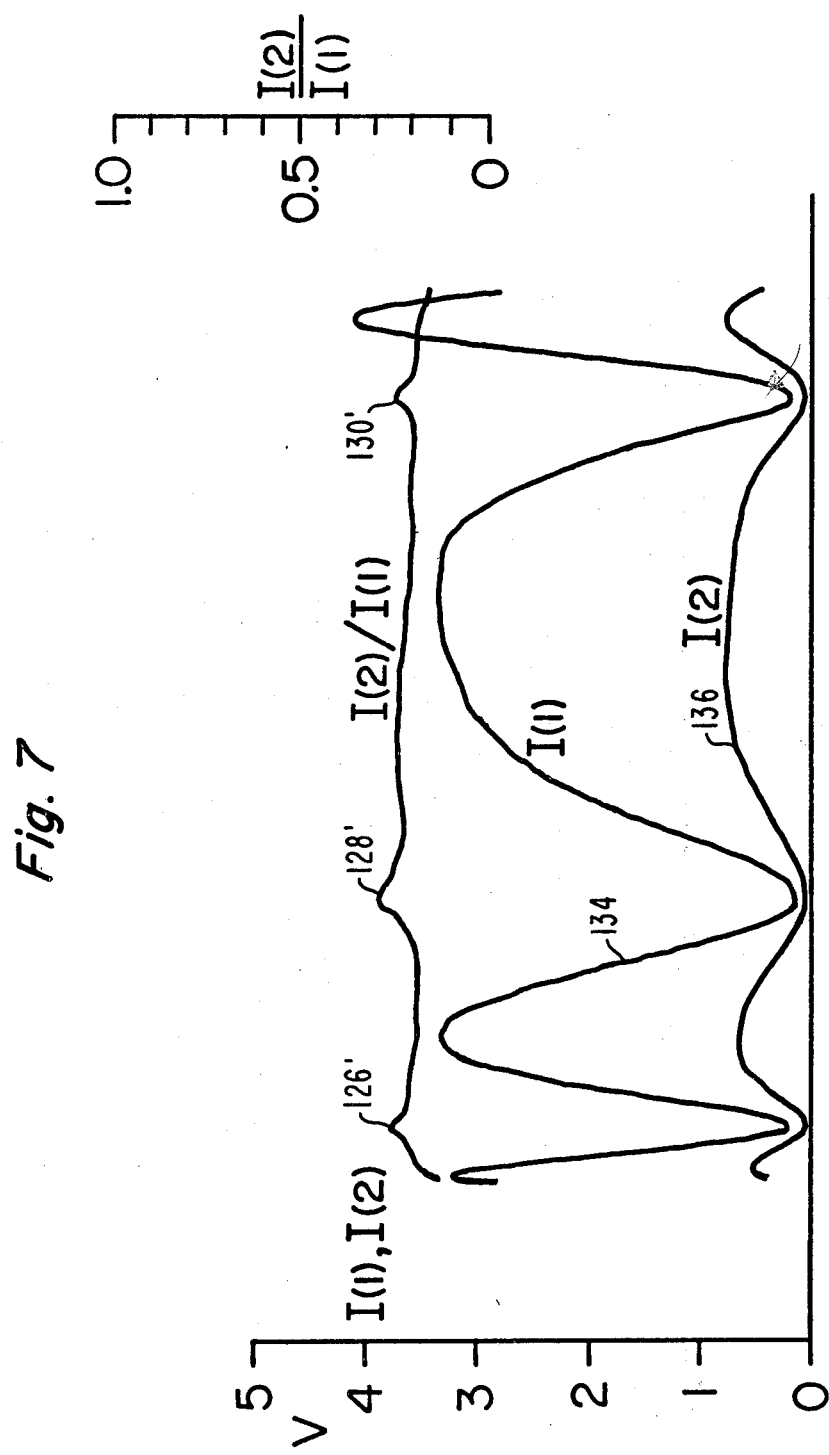
FIG. 7 is a plot of two diffraction orders taken separately to illustrate the effect on the combined diffraction order signal scan plot illustrated in FIG. 6.

The lift pen command is also provided by the comparator logic 104 responsive to the diffraction order signals, for example, I(1), I(2)/I(1). In this way nonvalid data can automatically be eliminated from the scan plots for diffraction orders I(1) smaller than a given level e.g., less than 0.1 V and/or for diffraction order I(2) values larger than I(1). Thus, the pen is lifted for diffraction signals by which I(1) is less than 0.1 V and I(2) is greater than I(1). Further discussions on this feature are illustrated in FIGS. 6 and 7 to be described.

The position of the beam 28b on the wafer 200 is traced by the position of the pen, not shown, on the x-y recorder 80. The detectors 31 and 32, preferably silicon photodiodes, are positioned to intersect the first and second order beams 41 and 42 from the grating 20 of the wafer 200. The output signals of these two detectors are proportional to I(1) and I(2), respectively and are rectified by phase sensitive amplifiers (PSA) 82 and 84, respectively, the respective outputs of the PSA amplifiers 82 and 84 are applied to a divider circuit 86 through the normally closed switches 88 and 89 to provide a signal on path 86a representing I(2)/I(1). This ratio signal is added to the y-input of the recorder 80 at summer 107 after attenuation by attenuator 90. Attenuator 90 serves to reduce the level of output divider 86 (typically 10 volts) for coupling to the summer 107 and subsequently the y-input to the recorder 80.

In order to develop the scan plot, motors 56 and 58 with suitable position control, as by an encoder, etc., cause the wafer to be moved first in an x-direction across the wafer in a direction transverse the grating lines 20 to develop a first scan line preferably at the bottom such as scan line 92 as shown in FIG. 5. Motor 56 is returned to the initial x-position and motor 58 causes the wafer 200 to be displaced in a downward, vertical direction so that the next line 94 is scanned. A position signal from motor 56 is carried on path 56a and passed through summer 107, applying the signal to the x-input of recorder 80.

Block 108 represents a bias voltage source potentiometer for providing horizontal lines for the micron scale 96 on the chart for measurement purposes. The numbers "0, 1, 2, 3 and 4" and the legend "$\mu$m" are later added by hand. The line width scale lines 97 and 98 generated at the left and right borders of the scan line are spaced at 2 mm intervals. This represents the system sampling interval of the entire surface of the wafer 200 of nominal size of 70 mm (2.75 inches) with scan lines that are nominally 2 mm apart.

For each scan line the pen is carried back to the left margin of the chart to provide the horizontal scale lines for scale 96 and scale 97 with the pen being lifted and dropped as required. While drawing the base lines for scale 97, the voltage sources 100 and 102 with switches 88 and 89 in the upward position provide y-signals to summer 107 such that a=2 micrometers. After each scan line 92, 94 etc., the right hand side base lines for scale 98 are drawn in the same manner.

As the wafer 200 is displaced vertically downward to generate each additional scan line, motor 58 provides a signal on path 58a as an input to summer 107 to be summed with the ratio signal I(1)/I(2). Accordingly, as the carriage 50 is moved in both the x and y directions to effect a scan by laser beam 28b over the entire surface of the grating pattern 20, scan lines 92, 94 etc., are plotted and drawn by the recorder 80. Vertical excursions from a reference horizontal line are related to deviations of the line width (a) from the nominal value of 2 micrometers in accordance with equation (3). For small deviations from the line width the excursions are roughly proportional to the deviation from the desired dimension in line width. It should be noted that the procedure of determining these deviations by the scanning technique does have a fundamental limitation. For an 8 micrometer grating, for example, the well-known Kirchoff condition of $d>>\lambda$ is satisfied. Nevertheless, the scalar theory can still be in error if the grating profiles (depth w) are too deep. We have discovered that this is the case for gratings etched into 12,000 Angstroms thick aluminum layers with the high conductivity of aluminum further contributing to the non-scalar behavior.

We have also discovered that another limitation in the practice of the invention is caused by the possible rounding of the grating lines 31. This rounding effect is an undesirable deviation from the rectangular wave condition (FIG. 3). Rounded grating lines occur in photoresist patterns as well known in the art.

According to the present invention, rounded grating lines will cause anomalous diffraction signal ratios manifested by poorly defined edges. This condition is identified by sharply deviating and therefore erratic scan lines. Whether or not the contour of the grating line can be defined, the fact that the grating line profile is significantly departing from the desired rectangular edge is significantly important to known in IC processing.

Refer now to FIG. 5 for a description of the format of a scan plot 110. Note that the plot of FIG. 5 is about two times the size of the actual wafer that was scanned. The scales 97 and 98 are graded with lines that are spaced two millimeters. The starting and ending y-location base lines 97a and 98a are the references for the first scan 92. Every fifth scan line with its corresponding base line is indicated by the dashed lines 98b, 98c, 98d, etc. The ratio of the diffraction orders I(2)/I(1) is plotted for each of the base lines in a positive direction starting with the zero millimeter base line 97a. Scale 96 on the extreme left portion of FIG. 5 provides a scale for the line width parameter a in micrometers. The scale is read downward from 0 $\mu$m indicating a negative slope by the equation (3), supra. Scale 96 is based on equation (3). Scale 96 is symmetrical around the line width value of a=2 micrometers for this plot and is non-linear with respect to that line width value. It should be understood hat line width scale 96 is designed for each line width that is to be monitored. Thus, for a 5 micrometer line width, the symmetrical point would be a=5 micrometers. Note that negative excursions of the ratio I(2)/I(1) causes positive excursions of the line width value a. Because of the behavior of equation (3), the scale 96 is conveniently read as the difference d-a for line width a values greater than 4 micrometers. Thus, it should be appreciated that the ratio I(2)/I(1) does not provide a means to distinguish between lines and spaces.

In order to determine quantitatively by graphical measurement the line width from a given point on the plot shown in FIG. 5, corresponding marks on the two y scales 97 and 98 are connected by a hand-drawn line as with a straight edge. The distance at the desired x-position between the corresponding base line and the scan line, for example, is measured. This distance measured from the line width a=2 micrometers on scale 96 gives the line width of the scan in question. In the plot shown in FIG. 5 all values of I(2)/I(1) are smaller than 0.5. In other words, all the line widths scanned are larger than 2 micrometers. The plot 110 of FIG. 5 illustrates how the line width values of a specimen wafer 200 are extracted from, for convenience, five standard reference positions which are indicated on FIG. 5 as 112, 114, 116, 118 and 120, positioned 2.54 cm. (one inch) above the center, of the wafer in the center, 2.54 cm. (one inch) below the center, 2.54 cm. (one inch) to the left and 2.54 cm. (one inch) to the right, respectively. The measured value of the line width at point 112, for example, is 2.4 $\mu$m being the plot distance from point 112 to point 112a is applied to scale 96 measured downward from the "2" $\mu$m reference line. Point 112a is at the intersection of the line drawn between the two 62 mm lines on scales 97 and 98 and the vertical line 110a. The average line width of the five values at points 112-120 may be conveniently called or identified as $\bar{a}$. Moreover, one can select from the entire area of the wafer plot 110, excluding a 10 millimeter wide rim to exclude abnormality of charting, the highest and lowest line width readings which are $a_{max}$ and $a_{min}$, respectively and marked for this particular wafer as points 121 and 122. For the wafer plot 110 these values were found to be $\bar{a}$=2.47 micrometers and the value $a_{max}-a_{min}$=2.73−2.18=0.55 micrometers.

Enumerable scan plots can be made of wafers, masks and the like that may vary in appearance from that shown in FIG. 5 very drastically. Experiments with the equipment providing these scan plots will readily demonstrate such variations to those of ordinary skill in this art in view of the description herein. Several more examples are illustrated for illustrative purposes only and not by way of limitation of the kinds of scan plots that the apparatus of the invention can provide.

Refer now to FIG. 6 which shows a scan plot 124 of a particular wafer in which silicon dioxide grating lines are developed on an unetched Si-layer on sapphire. Note the three ridges 126, 128 and 130. These ridges are clearly striking departures from the expected scan plots that are generally uniform with minimum excursions such as scan line 132. Unfortunately, these ridges do not correspond to the actual changes of line width as has been verified by extensive studies of the surface with a microscope. The reasons for these excursions became clear after an analysis of a scan of the first and second order diffraction signals I(1) and I(2) made separately through the center base line at y=30 millimeters. A plot of the separate diffraction order scan is shown in FIG. 7. It shows the response of the ratio of the diffraction orders compared to the individual diffraction order signals. It will be noticed that the ridges 126, 128 and 130 (FIG. 6) correspond to the scan line at the 30 millimeter y-location 132 at points 126', 128' and 130' (FIG. 7), respectively. It will be noticed that the I(1) curve plot 134 manifests wide variations while the plot 136 of the second order I(2) has smaller excursions. An analysis of the structure of the wafer used for plot 124, recalling that this is a three layered structure including silicon dioxide lines, shows that there are certain distinct thicknesses of the epi-layer where the I(1) curve plot 134 is low. With a slightly non-uniform thickness of the epi-layer, this condition will occur along certain lines which are at the location of the ridges 126, 128 and 130.

In practice, the grating lines 21 are not completely rectangular in cross section as shown in FIG. 2. This results in a contribution to the diffraction curves 134 and 136 for which equation (3), supra, does not apply. This type of error is small under normal circumstances. However, this error becomes large due to interference effects if the regular (non-edge) part of the diffraction signals I(1) and I(2) is small. Accordingly, comparator logic 104 is arranged to provide a signal to lift the recorder pen whenever the diffraction signal I(1) is below a given level.

Figure 8:
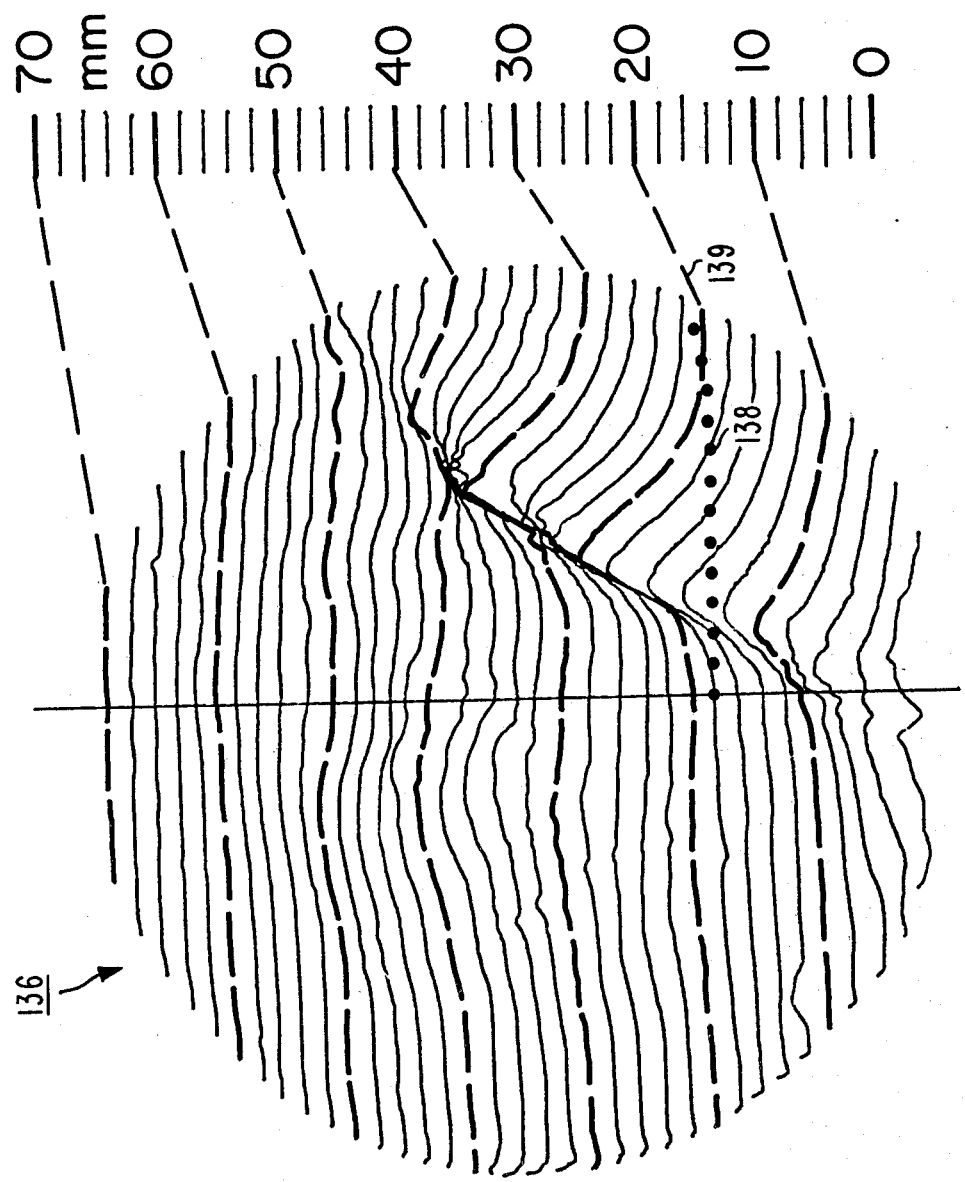
FIG. 8 illustrates a still further example of a scan in which the very pronounced excursion in the scans manifests a "deep" edge effect.

FIG. 8 is an illustration of a scan plot 136 of a grating (20 of FIG. 2) etched into a 12,000 angstrom thick aluminum layer on an SOS wafer. Also on the plot are a number of points 138 representing microscopic measurements near the ordinate y=20 millimeters. This ordinate coincides with one of the dashed scan lines viz, line 139. Note that the line width scale 96' at the left is different from all other plots 96 described hereinabove. This scale 96' is expanded to provide for the larger line width variations of this wafer. As mentioned above, it appears that the Kirchoff-Fraunhofer approximation is not always valid for aluminum gratings. Points 138 were determined from microscope studies of the actual contour that should have been produced by the laser scan ending along the dashed line 139 at the 20 mm scale line. Thus, the chart plot 136 is in error. The error is believed to be due to the 12,000 angstroms thick aluminum lines. If the lines had been only 6,000 angstroms thick, the plot would have been valid, i.e. points 138 would have followed line 139. Nevertheless, the plot 136 is useful as a first order approximation for determining the line width of the grating.

Figure 9:
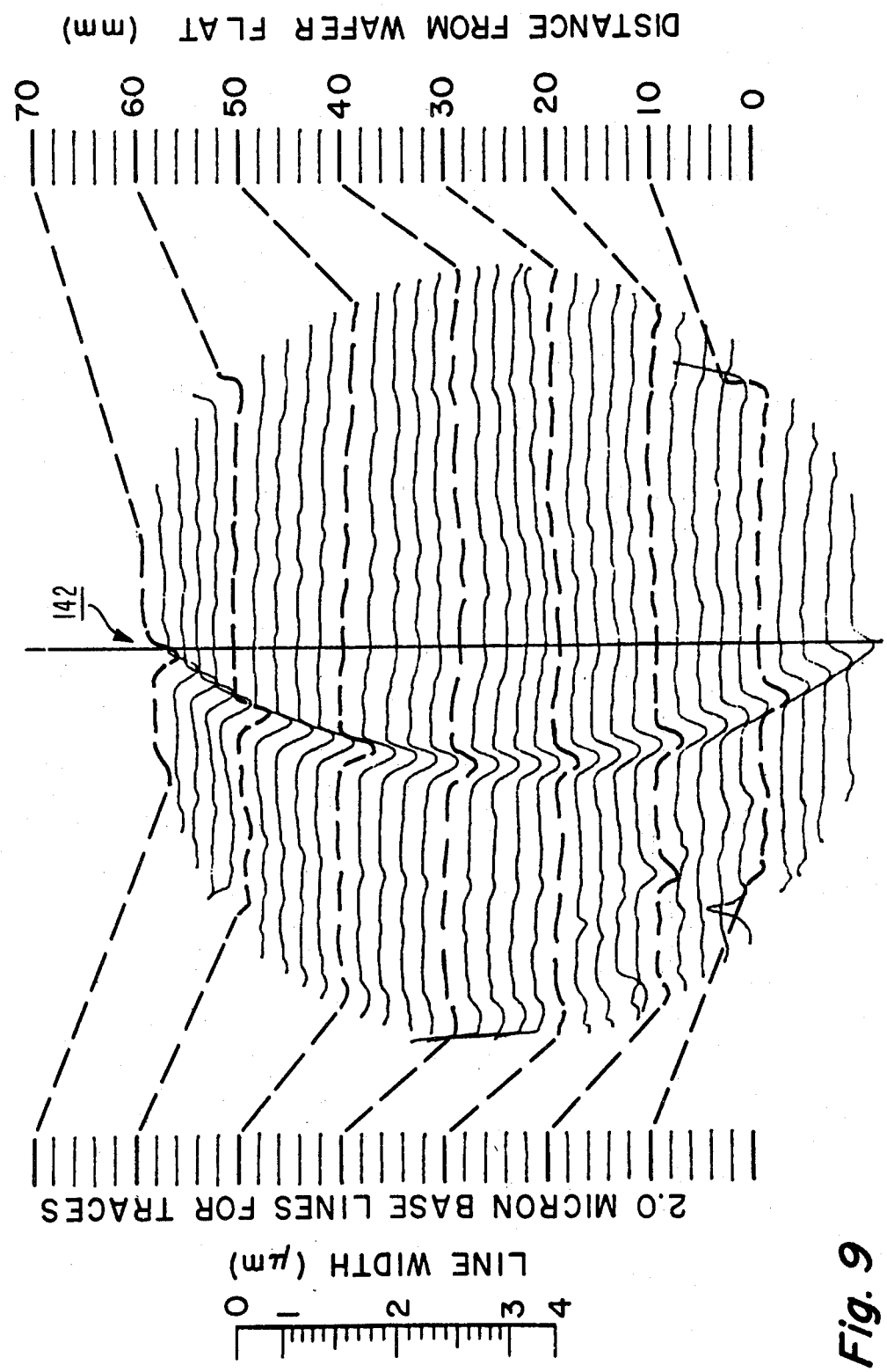
FIG. 9 is still a further example of a scan plot which illustrates a real line with an "error"

The curve plot 140 shown in FIG. 9 in which the ridge 142 shows a 0.2 micrometer error along a portion of the wafer is an illustration of the extremely excellent sensitivity the wafer scanning technique provides.

Figure 10:
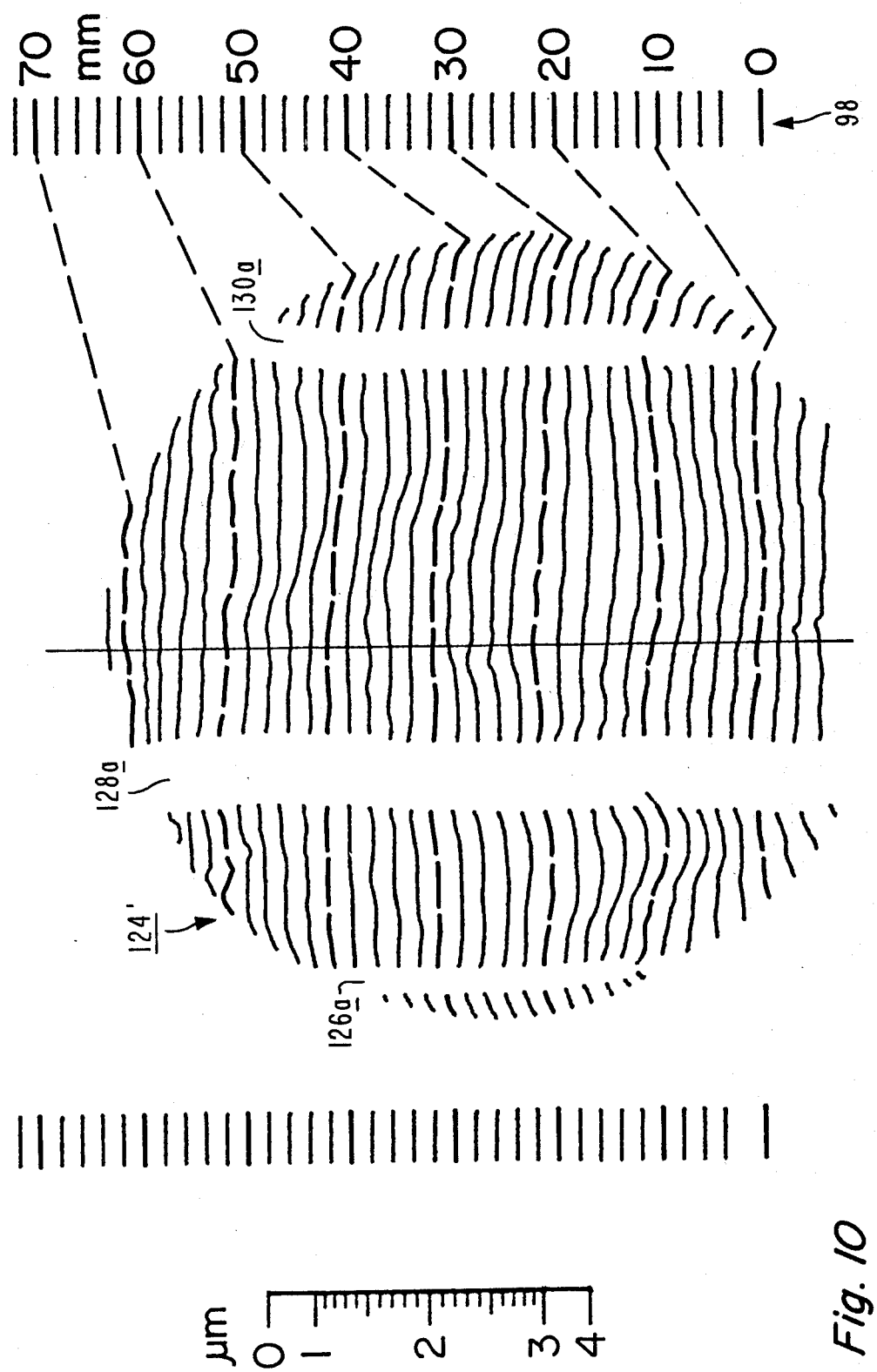
FIG. 10 is a scan in which the recorder does not record portions with indefinite data.

FIG. 10 is a curve plot 124' of the wafer that is illustrated by scan 124 in FIG. 6. The blank portions 126a, 128a and 130a were caused by the pen being lifted from the recorder while portions 126, 128 and 130, (shown in FIG. 6) respectively, were being scanned. Since the conditions set forth in FIG. 4 for the lift pen control were violated, the pen was lifted.

What has been described hereinabove is the aspect of the present invention by which the line width of a specimen monitor wafer 200 formed entirely of diffraction gratings 20 may be scanned to determine the line width of the grating at that particular stage of the image transfer process described above and outlined by the flow chart illustrated in FIG. 1. In addition to determining the line width, the depth of the grating lines can be determined by a measurement of the zero order diffraction signal I(0) and one or more of the higher order diffraction signals I(1), I(2), I(3), I(n) etc. Any one of such ratios can be measured by suitable implementation of the apparatus shown in FIG. 4.

Moreover, the invention can provide during the scan plot of a particular monitor wafer the edge profile of the grating lines 21. The edge profile is a deviation from the square wave profile illustrated in FIG. 3. Deviation from the square wave profile will be manifested in a loss of the expected ratio between three or more sets of diffraction orders. Thus, the edge profile is determined from any of three ratios of the series Im/In, where m=1,2,3, ... and n=1,2,3 ....

Moreover, the invention provides a means for determining gross imperfections in the diffraction grating 20 to indicate process errors. Gross errors in the diffraction pattern are readily discernible to the naked eye of an observer. Thus, the absence or gross distortion of a group of lines in a portion of the diffraction pattern are readily seen even with diffraction lines that are 2 micrometers wide. Such gross defects in conventional IC processing require observations with high power microscopes. The sample wafer or mask of the present invention provides a means to determine rapidly such gross errors by providing thereby a visually discernible map of a defective portion of the wafer.

In practice, as the product wafers or masks and monitor wafers or masks are prepared at a given stage, visually discernible gross defects in the diffraction pattern can be quickly correlated with corresponding area portions of the product. Defects in the diffraction pattern are quite likely to be defects in a corresponding portion of the product. Such knowledge can be used to identify and correct the problem in the equipment or materials at the process step. It should thus be appeciated that this feature of the invention is a significant and powerful tool in monitoring IC processes.

The apparatus shown in FIG. 4 may be arranged into an image processing system to utilize digital signal format for processing by a computer to generate therefrom information in the form of a printed copy of data indicative of the line parameter information that is determined from a scan of a wafer. Moreover, the system provides a means for having a display of the data on a real or stored time basis on a CRT and, if desired, a chart recorder as described hereinabove and shown in the embodiment in FIG. 4.

As shown in FIG. 11, such a modified system is arranged to include the laser 26 generating a beam 28b by reflection from the mirror 66 to a wafer 180 mounted on the x-y moving structure 50. The diffracted beams 40 . . . 46, etc. are sensed by, for example, detectors 30, 31, 32, 33, 34 (shown in FIG. 2), as well as higher order diffraction signal detectors 33 and 39. The detected signals are passed to a high speed analog to digital converter (A/D) 150 to provide digital signals to a computer 153 via bus 152. A memory 154 is coupled via bus 156 to the computer 153. Positional signals in analog form from the x-motor 56 and y-motor 58 are applied to the A/D converter 150.

Control electronics 158 under control of an operator's console 160 is used to monitor the operation of the system via bus 159. A printer 164 receives suitable control signals from the computer 153 to provide a hardcopy, print-out of data corresponding to each scan. Moreover, a CRT 166 may be used to provide a means to monitor the contour lines without using a chart recorder, or, as previously described, a chart recorder 168 can be used in the system in the manner described in detail for the use of the chart recorder 80 shown in FIG. 4.

In operation, a wafer 180 is positioned on the apparatus 50 for scanning by the incident laser beam 28b. The diffraction signals I(0) . . . I(n) are detected and passed to the high speed A/D converter 150 and thence to the computer 153 for storage and analysis. After the entire wafer has been scanned, the data is stored in a memory 154 location representing the first stage (1) of a plurality of stages that the wafer 180 is to be processed. After the wafer has been removed from the equipment and processed along with the product wafers, at a selected stage the wafer will then be placed on the equipment holder 50 for a monitor scan. The results of this scan are stored in memory 154 location 2. In a similar fashion the wafer is processed from stage-to-stage and scanned to provide additional line parameter information for storage in location 3. At the end of each selected stage the computer will be controlled to provide computations of the difference of each line at a given stage to the parameters of that same line at a subsequent stage. This information can be displayed on the CRT or tabulated in any form desirable and produced on a hard copy by printer 164 for subsequent study. It will be appreciated that either of the chart recorders 168 or 80 can be used only to provide a record of a scan of the particular wafer. However a plot on recorder 168 of the line width differences alone between stages can be made, in which computer 153 performs the linewidth difference calculations.

The diffraction orders used in the computation depends on what parameter of the line one wants to compare. As described above, the ratio of the first to second order diffraction signals is used to determine line width. The ratio of one or more of those or other diffraction signals can be used to indicate the profile of the lines relative to the rectangular form (FIG. 3). Mathematically the profile relationship can be represented as follows:

$$Profile = f[I(n)/I(m), I(j)/I(m) \ldots ] \quad (4)$$

where n, m and j are integers and different diffraction orders.

To obtain an indication of the thickness of the diffraction lines, the 0 order diffraction signal is needed. The relationship of the thickness is represented by the relationship:

$$Thickness = f[I(0)/I(n)] \quad (5)$$

In practice, the data derived from a scan of the test sample to determine depth deviations, and profile deviations, derived from an analysis of the diffraction signals defined by equations 4 and 5 are preferably processed in numerical form. While visual displays on the chart recorder and/or the CRT will be useful in evaluating each computation, only one set of ratios can be displayed at a time in order to avoid confusion in the display.

It will now be seen that the invention provides a means for following the LSI fabrication process on a stage-by-stage basis, i.e. the development of an integrated circuit for LSI from the conceptual computer form to the final LSI device. Each stage of the process uses a grating test mask or wafer which can be processed as a monitor with the desired product wafers or masks. The monitor wafer having the preformed grating can be evaluated stage-by-stage for degradation of the line widths. These degradations can then be used as a fair measurement of the degradation of the actual LSI wafer or mask of predetermined circuit form. In practice, the stage between the mask (12-FIG. 1) to the photoresist stage (14) manifests the most major degradations. It is in this step that the invention it seems will be most useful and practical. Moreover, the invention is quite useful for monitoring the fabrication of masks, silicon film and oxide film lines. In general, the invention is not suitable for lines made of aluminum and photoresist on aluminum film at least to the extent as explained in detail hereinabove.

Certain aspects of this description are disclosed in the following publications:

A paper by H. P. Kleinknecht, H. Meier and W. E. Ham, "Use of Large Area Grating Patterns for Scanning of Linewidth Across IC Masks and Wafers," Abstract S35, p. 203, Europhysics Conference Abstracts ESSDERC, '80 York, England 15–18, Sept. 1980 and a paper by W. E. Ham, H. P. Kleinknecht and H. Meier, "A Method for Determining the Sources of LSI Linewidth Errors in IC Processes," Abstract S36, p. 205, Europhysics Conference Abstracts ESSDERC, '80 York, England 15–18, Sept. 1980.

We claim:

1. In a method for optically measuring the line parameters including line width dimensions, line edge profile or line thicknesses of a diffraction pattern of material disposed on a test sample, said diffraction pattern comprised of a planar array of spaced strips of material having a strip width a and periodicity d, including the steps for exposing and diffraction pattern to a beam of monochromatic light to diffract said beam into diffracted beams of various orders, and for detecting and measuring the intensity of at least two of the diffracted beams to obtain at least two intensity signals, wherein the improvement comprises the steps of:

scanning said light beam over the grating pattern of the test sample, the beam having a diameter substantially greater than the width of the grating strips, and generating continuously information signals representing the diffracted order beams as the beam is scanned over the diffraction pattern, deviations of said information signals from a predetermined reference being a measure of the change in line parameters comprising essentially the lateral dimensions of the lines, the thickness of the lines, and the profile of the edge of the lines of the diffraction pattern.

2. The method of claim 1, wherein said light beam has a diameter of one millimeter, the grating width a is 2 micrometers, and the periodicity is 8 micrometers.

3. The method of claim 2, wherein said light beam has a wavelength of 623 nanometers.

4. The method of claim 1, wherein the scanning step comprises the steps of:
supporting said substrate on a carriage movable in both x and y directions, and
directing said beam of light in a fixed direction onto the diffraction pattern to generate said diffracted beams of light.

5. The method of claim 4 for displaying said information signals on an x-y chart recorder, wherein the x and y direction of movement of said test sample is followed on the chart recorder.

6. The method of claim 4 for printing data corresponding to said line parameters further comprising the steps of:
converting the information signals to digital format, computing the ratios of said diffraction order signals,
storing into memory the information representing the calculated ratios corresponding to each one of a series of processing steps made on said test sample, and
comparing the information in said memory to determine the changes in line parameters of said test sample.

7. The method of claim 4 for displaying said information signals on a display of a CRT, wherein the x and y direction of movement of said test sample is followed on the CRT display.

8. The method of claim 1, wherein the diffracted beams are of the first and second order, and further comprising the step of determining line width deviations by comparing the information data signals in the form of a series of scanned lines to a reference dimension.

9. The method of claim 1, wherein the diffracted beams include at least three sets of higher order beams other than the zero order and further includes the step of comparing said three sets of diffracted beams to determine the edge profile of the diffraction grating strips.

10. The method of claim 1, wherein the diffracted beams include at least two sets of diffraction beams including the zero order and the first or second order and further comprising the step of comparing said two sets to determine the grating strip depth.

11. The method of claim 1, wherein said scanning step comprises scanning the pattern with a polarized beam of light, the direction of polarization being parallel to the plane of incidence of the light beam, the angle of incidence being such that the tangent of the angle of incidence is equal to the refractive index of the material of the grating lines, and the lines of the grating being in the plane of incidence of the light beam.

12. A method for optically monitoring the image transfer process for an LSI device by:
scanning a test sample comprising a specimen monitor substrate or mask having a large area diffraction pattern thereof with a monochromatic light beam having a diameter that is substantially smaller than the size of said grating pattern,
measuring while scanning with said light beam the physical parameter of width, depth and edge profile of the diffraction grating by comparing one or more pairs of a plurality of pairs of diffracted beams of various orders,
repeat processing of said test sample in progressive stages of the image transfer process, and
repeat said scanning and measuring steps to determine deviations of said parameters from the previous stage.

13. In an apparatus for optically measuring the line parameters including line width dimensions, line edge profile or layer thicknesses of a diffraction pattern of material disposed on a test sample, said diffraction pattern comprised of a planar array of spaced strips of material having a strip width a and periodicity d, said apparatus including means for exposing said diffraction pattern to a beam of monochromatic light to diffract said beam into diffracted beams of various orders, detector means including detectors for measuring the intensity of at least two of the diffracted beams to obtain at least two intensity signals, wherein the improvement comprises:
means for scanning said light beam over the grating pattern of the test sample,
the beam having a diameter substantially greater than the width of the grating strips, and
means for generating continuously information signals representing the diffracted order beams as the beam is scanned over the diffraction pattern, deviations of said information signals from a predetermined reference being a measure of the change in line parameters comprising essentially the lateral dimensions of the lines, the thickness of the lines, and the profile of the edge of the lines of the diffraction pattern.

14. The apparatus of claim 13, wherein said light beam has a diameter of one millimeter, the grating width a is 2 micrometers, and the periodicity d is 8 micrometers.

15. The apparatus of claim 14, wherein said light beam has a wavelength of 623 nanometers.

16. The apparatus of claim 13, wherein the scanning means comprises:
means for supporting said test sample on a carriage movable in both x and y directions, and
directing said beam of light in a fixed direction onto the diffraction pattern to generate said diffracted beams of light.

17. The apparatus of claim 13, wherein the diffracted beams are of the first and second order, and further comprising means for determining line width deviations by comparing the information data signals in the form of a series of scanned lines to a reference dimension.

18. The apparatus of claim 13, wherein the diffracted beams include at least three sets of higher order beams other than the zero order and further includes means for comparing said three sets of diffracted beams to determine the edge profile of the diffraction grating strips.

19. The apparatus of claim 13, wherein the diffracted beams include at least two sets of diffraction beams including the zero order and the first or second order and further comprising means for comparing said two sets to determine the grating strip depth.

20. The apparatus of claim 13, wherein said scanning means includes means for polarizing said light beam of monochromatic light, such that the direction of polarization is parallel to the plane of incidence of the beam, the angle of incidence being such that the tangent of the angle is equal to the refractive index of the material of the grating lines and the lines of the grating being in the incidence plane.

21. A method for optically monitoring the image transfer process for an LSI device by:
preparing by a given process a product wafer or mask with selected patterns extending over a selected area thereon, and preparing by said given process a test sample comprising a specimen monitor mask or wafer having a diffraction pattern extending over an area thereon substantially equal to the pattern area of said product wafer or mask,
gross defects in the diffraction pattern of said specimen monitor mask or wafer being visually discernible and being indicative thereby of similar defects at corresponding area portions on said product wafer or mask.

* * * * *